US012610533B2

(12) United States Patent
Huang

(10) Patent No.: US 12,610,533 B2
(45) Date of Patent: Apr. 21, 2026

(54) SEMICONDUCTOR STRUCTURE, METHOD FOR MANUFACTURING SAME, AND SEMICONDUCTOR MEMORY

(71) Applicant: CHANGXIN MEMORY TECHNOLOGIES, INC., Hefei City (CN)

(72) Inventor: Meng Huang, Hefei City (CN)

(73) Assignee: CHANGXIN MEMORY TECHNOLOGIES, INC., Hefei City (CN)

( * ) Notice: Subject to any disclaimer, the term of this patent is extended or adjusted under 35 U.S.C. 154(b) by 559 days.

(21) Appl. No.: 18/169,851

(22) Filed: Feb. 15, 2023

(65) Prior Publication Data

US 2024/0081046 A1    Mar. 7, 2024

(30) Foreign Application Priority Data

Sep. 7, 2022    (CN) .......................... 202211091229.1

(51) Int. Cl.
*H10B 12/00*          (2023.01)
(52) U.S. Cl.
CPC ........... *H10B 12/482* (2023.02); *H10B 12/02* (2023.02)

(58) Field of Classification Search
CPC ...... H10B 12/482; H10B 12/02; H10B 12/03; H10B 12/05; H10D 1/714; H01L 21/764
See application file for complete search history.

(56) References Cited

U.S. PATENT DOCUMENTS

2021/0257366 A1* 8/2021 Lee ......................... H10B 12/50
2023/0413517 A1* 12/2023 Kim ....................... H10B 12/48

FOREIGN PATENT DOCUMENTS

CN            112216318 A      1/2021

* cited by examiner

*Primary Examiner* — Mohammed R Alam
(74) *Attorney, Agent, or Firm* — SYNCODA LLC; Feng Ma

(57)          ABSTRACT

A semiconductor structure includes: a substrate; and a plurality of device structures, a plurality of bit line structures and a plurality of word line structures formed on the substrate. The device structure extends in a first direction, and the word line structure extends in a second direction, and the bit line structure extends in a third direction. The device structure includes a capacitor area and an active area. The bit line structure is electrically connected to the active areas arranged in the third direction. Herein, at least some of the bit line structures are formed with air gaps around them.

11 Claims, 31 Drawing Sheets

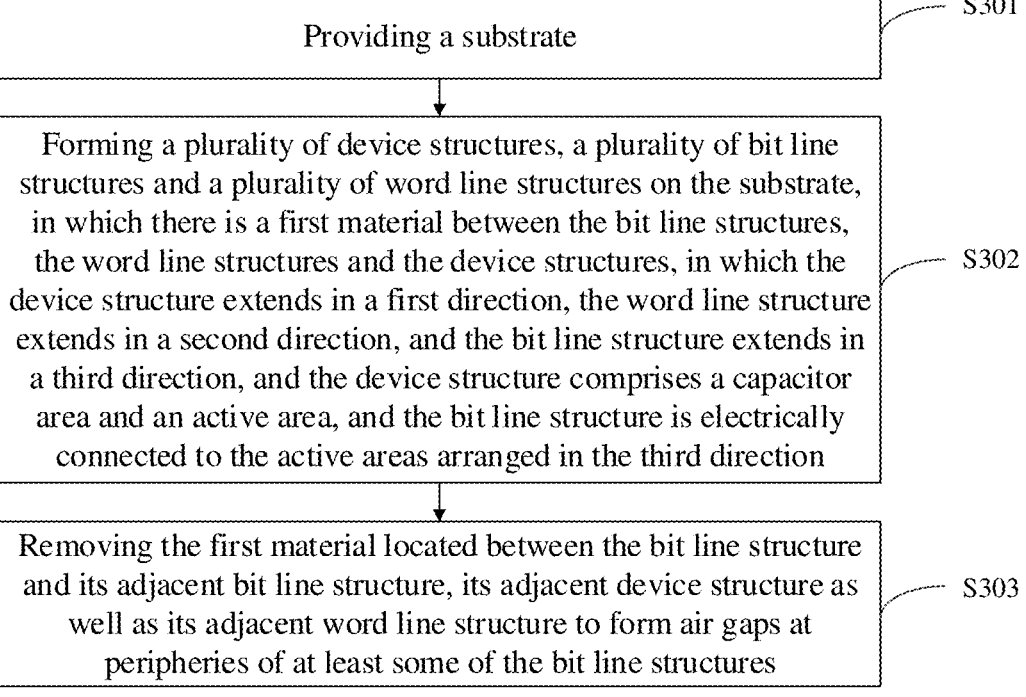

┌────────────────────────────────────────────────┐
│              Providing a substrate               │—— S301
└────────────────────────────────────────────────┘
                         ↓
┌────────────────────────────────────────────────┐
│   Forming a plurality of device structures, a plurality of bit line   │
│  structures and a plurality of word line structures on the substrate,  │
│   in which there is a first material between the bit line structures,  │
│    the word line structures and the device structures, in which the    │—— S302
│ device structure extends in a first direction, the word line structure │
│ extends in a second direction, and the bit line structure extends in   │
│  a third direction, and the device structure comprises a capacitor   │
│   area and an active area, and the bit line structure is electrically   │
│    connected to the active areas arranged in the third direction      │
└────────────────────────────────────────────────┘
                         ↓
┌────────────────────────────────────────────────┐
│ Removing the first material located between the bit line structure  │
│ and its adjacent bit line structure, its adjacent device structure as │—— S303
│   well as its adjacent word line structure to form air gaps at     │
│      peripheries of at least some of the bit line structures       │
└────────────────────────────────────────────────┘

SEMICONDUCTOR STRUCTURE, METHOD FOR MANUFACTURING SAME, AND SEMICONDUCTOR MEMORY

CROSS-REFERENCE TO RELATED APPLICATION

The present application claims priority to Chinese Patent Application No. 202211091229.1 filed on Sep. 7, 2022, the disclosure of which is hereby incorporated by reference in its entirety.

BACKGROUND

Sensing margin is one of important characteristic parameters of a dynamic random access memory (DRAM). Currently, with the shrinking of a size of the DRAM device, the sensing margin becomes poor, which limits a further improvement of performances of the memory.

SUMMARY

Embodiments of the disclosure provide a semiconductor structure, a method for manufacturing the same, and a semiconductor memory, which can reduce parasitic capacitance of a bit line and improve sensing margin of a device.

In a first aspect, embodiments of the disclosure provide a semiconductor structure. The semiconductor structure includes: substrate; a plurality of device structures, a plurality of bit line structures and a plurality of word line structures formed on the substrate, in which the device structure extends in a first direction, and the word line structure extends in a second direction, and the bit line structure extends in a third direction, and the device structure includes a capacitor area and an active area, and the bit line structure is electrically connected to the active areas arranged in the third direction, in which air gaps are formed at peripheries of at least some of the bit line structures.

In a second aspect, embodiments of the disclosure provide a method for manufacturing a semiconductor structure, which includes the following operations.

A substrate is provided.

A plurality of device structures, a plurality of bit line structures and a plurality of word line structures are formed on the substrate, in which there is a first material between the bit line structures, the word line structures and the device structures. The device structure extends in a first direction, and the word line structure extends in a second direction, and the bit line structure extends in a third direction. The device structure includes a capacitor area and an active area. The bit line structure is electrically connected to the active areas arranged in the third direction.

The first material located between the bit line structure and its adjacent bit line structure, its adjacent device structure as well as its adjacent word line structure is etched to form air gaps at peripheries of at least some of the bit line structures.

In a third aspect, embodiments of the disclosure provide a semiconductor memory including the semiconductor structure as described in the first aspect.

BRIEF DESCRIPTION OF THE DRAWINGS

FIG. 4 is a flowchart of a method for manufacturing a semiconductor structure provided by embodiments of the disclosure;

DETAILED DESCRIPTION

Figure 1A:
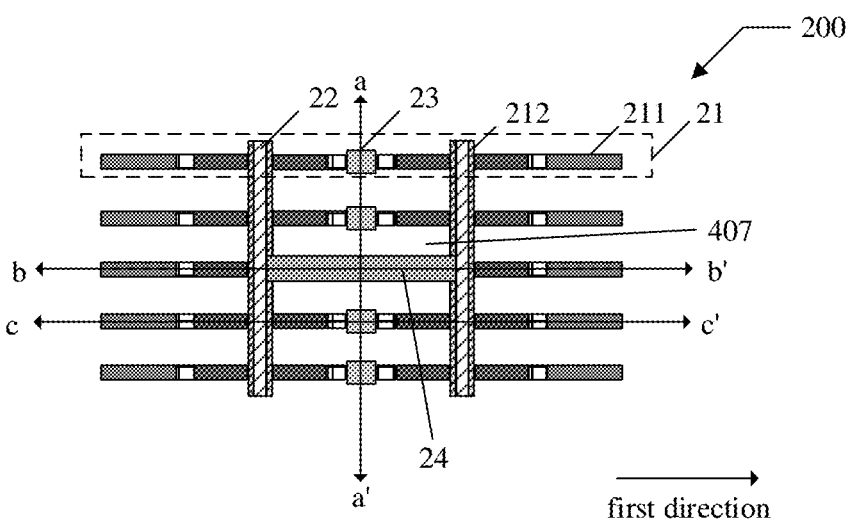
FIG. 1A is a schematic structural diagram 1 of a semiconductor structure provided by embodiments of the disclosure.

The technical solutions of embodiments of the disclosure will be clearly and fully described below with reference to the drawings in the embodiments of the disclosure. It can be understood that specific embodiments described herein are only used to explain the related disclosure, but not to limit the disclosure. In addition, it should also be noted that, for convenience of description, only parts related to the related disclosure are shown in the drawings.

Unless otherwise defined, all technical and scientific terms used herein have same meanings as commonly understood by one person skilled in the art to which this disclosure belongs. Terms used herein are for the purpose of describing specific embodiments only and are not intended to limit the disclosure.

In the following description, reference is made to "some embodiments" that describe subsets of all possible embodiments, but it should be understood that "some embodiments" may be the same subset or different subsets of all possible embodiments and may be combined with each other without conflict.

It should be noted that, the term "first/second/third" referred to in the embodiments of the disclosure is used only to distinguish similar objects, and does not represent a specific ordering of objects. It can be understood that the "first/second/third" may be interchanged in a particular order or sequence where permitted, to enable the embodiments of the disclosure described herein to be implemented in an order other than that illustrated or described herein.

With a shrinking of a size of a DRAM device, a distance between its various structures is getting smaller and smaller, which brings challenges to a production of a semiconductor memory. In the current DRAM, a pseudocapacitance of a bit line structure is great, which reduces sensing margin of the device.

Based on this, embodiments of the disclosure provide a semiconductor structure, which includes: a substrate; and a plurality of device structures, a plurality of bit line structures and a plurality of word line structures formed on the substrate. The device structure extends in a first direction, and the word line structure extends in a second direction, and the bit line structure extends in a third direction. The device structure includes a capacitor area and an active area. The bit line structure is electrically connected to the active areas arranged in the third direction. Herein, air gaps are formed at peripheries of at least some of the bit line structures. In this way, the bit line structure and frame structures at two sides thereof are used for playing a supporting role, and the frame structures are used as an etching stop layer, and the first material located between the bit line structure and its adjacent bit line structure, its adjacent device structure as well as its adjacent word line structure is removed, so that the air gaps are formed at the peripheries of at least some of the bit line structures, thus reducing parasitic capacitance of a bit line and improving sensing margin of a device.

The embodiments of the disclosure will be described in detail below with reference to the accompanying drawings.

Figure 1B:
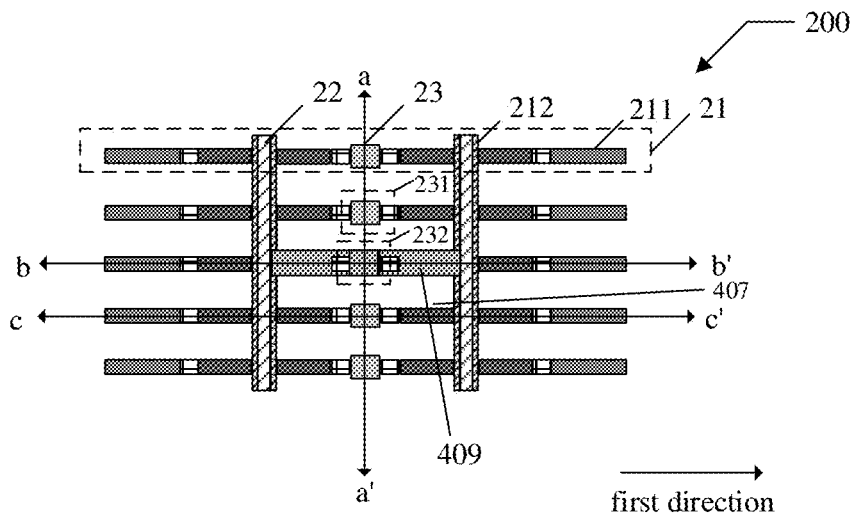
FIG. 1B is a schematic structural diagram 2 of a semiconductor structure provided by embodiments of the disclosure.

In an embodiment of the disclosure, referring to FIG. 1A or FIG. 1B, a semiconductor structure 200 may include: a substrate (not shown in FIG. 1A and FIG. 1B); and a plurality of device structures 21, a plurality of bit line structures 23 and a plurality of word line structures 22 formed on the substrate. The device structure 21 extends in a first direction, and the word line structure 22 extends in a second direction, and the bit line structure 23 extends in a third direction. The device structure 21 includes a capacitor area 211 and an active area. The bit line structure 23 is electrically connected to the active areas arranged in the third direction.

Herein, air gaps 407 are formed at peripheries of at least some of the bit line structures 23.

It should be noted that, the semiconductor structure 200 can be applied to a dynamic random access memory (DRAM), for example, a three dimensional DRAM (3D DRAM). Currently, the sensing margin of the device can be improved by increasing capacitance of a capacitor or reducing capacitance of a bit line. According to the embodiment of the disclosure, parasitic capacitance of a bit line is reduced by forming an air gap 407 at a periphery of the bit line structure 23, thereby improving sensing margin of a device.

It should be understood that, in the semiconductor structure 200, some of the bit line structures 23 are filled with a second material 409, and others of the bit line structures 23 are provided with the frame structure 212. Accordingly, FIG. 1A and FIG. 1B show part of a schematic diagram of a semiconductor structure 200, in which the bit line structure 23 is filled with a second material, while subsequent FIG. 2 and FIG. 3 show part of a schematic diagram of a semiconductor structure 200, in which the bit line structure 23 is provided with the frame structures 212.

Figure 2:
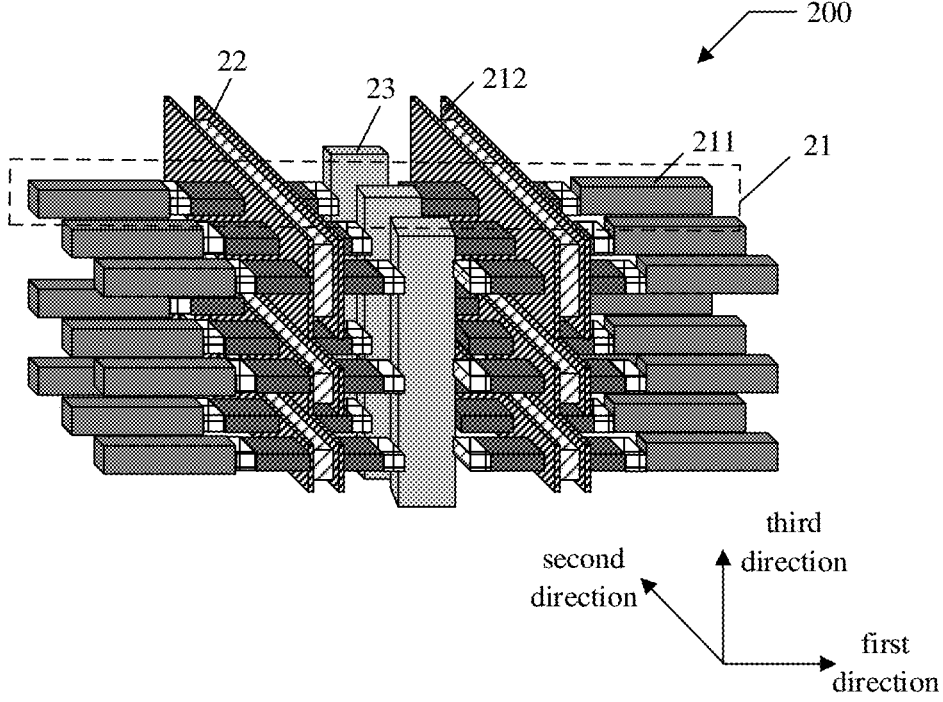
FIG. 2 is a schematic three-dimensional structure diagram of a semiconductor structure provided by embodiments of the disclosure.
Figure 3:
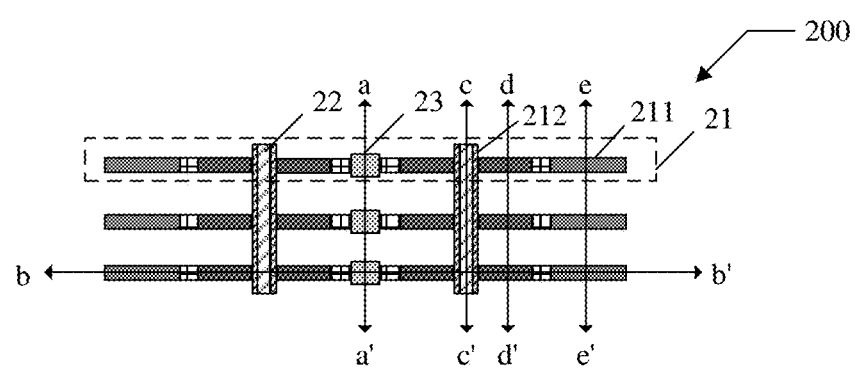
FIG. 3 is a schematic structural diagram of another semiconductor structure provided by embodiments of the disclosure.

Herein, FIG. 2 is a schematic three-dimensional structure diagram, and FIG. 3 is a cross-section structure schematic diagram of FIG. 2. As shown in FIG. 2 and FIG. 3, the semiconductor structure 200 also includes a substrate (not shown in the figures), device structures 21, word line structures 22, and bit line structures 23, but no second material 409 is filled around the bit line structure 23.

It should be noted that, the substrate may be a silicon substrate or made of other semiconductor elements, for example, germanium (Ge), or may include a semiconductor compound, for example, silicon carbide (SiC), gallium arsenide (GaAs), gallium phosphide (GaP), indium phosphide (InP), indium arsenide (InAs) or indium antimonide (InSb), or may include other semiconductor alloys, for example, silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or combinations thereof. The embodiments of the disclosure are not specifically limited to this.

It should be noted that, a material of the active area may be silicon (Si), and the active area may also be divided into multiple doping regions. Doping types of different doping regions are different, for example, N-type doping (providing free electrons) and P-type doping (providing holes). Herein, the N-type doping can be performed with phosphorus (P), antimony (Sb), arsenic (As) or other pentavalent impurity elements, and the P-type doping can be performed with boron (B), gallium (Ga), indium (In) or other trivalent impurity elements.

It should be noted that, according to the embodiments of the disclosure, the air gaps are formed at the peripheries of at least some of the bit line structures. The peripheries of the bit line structures refer to regions for forming the air gaps in the first direction, the second direction, the third direction.

In the embodiments of the disclosure, the first direction refers to an extending direction of the device structure, and the second direction refers to an extending direction of the word line structure, and the third direction refers to an extending direction of the bit line structure.

In some embodiments, as shown in FIG. 2, frame structures 212 are provided on two sides of the word line structures 22 in the first direction.

A plurality of frame structures 212 arranged in succession in the third direction are provided at a first side of the bit line structures 23, and another plurality of frame structures 212 arranged in succession in the third direction are provided at a second side of the bit line structures 23.

Herein, the first side and the second side are opposite in the first direction. It should be noted that, the frame structures are distributed on the two sides of the word line structures and mainly play a supporting role. In the embodiments of the disclosure, a first material located between the bit line structure and its adjacent bit line structure, its adjacent device structure as well as its adjacent word line structure is removed with the frame structures as an etching stop layer, so that the air gaps are formed at the peripheries of at least some of the bit line structures, thus reducing parasitic capacitance of a bit line and improving sensing margin of a device.

In a specific embodiment, as shown in FIG. 1A, there are a plurality of bit line regions on the substrate. Some of the bit line regions are provided with bit line structures 23 and frame structures 212 located at two sides of the bit line structures 23, and others of the bit line regions are provided with dummy structures 24.

It should be noted that, referring to FIG. 1A, it is shown that one dummy structure 24 is formed every two bit line structures 23. In addition, one dummy structure 24 may be formed every three bit line structures 23 or every four bit line structures 23. Alternatively, one dummy structure 24 may be formed every three bit line structures 23, and another dummy structure 24 may be formed every four bit line structures 23. The embodiments of the disclosure are not specifically limited to this.

In another specific embodiment, as shown in FIG. 1B, the bit line structures 23 include a first type of bit line structures 231 and a second type of bit line structures 232.

Herein, in the first direction, an air gap 407 exists between the first type of bit line structure 231 and its adjacent frame structures 212; and in the second and third directions, an air gap 407 exists between the first type of bit line structure 231 and its adjacent bit line structure 23, its adjacent device structure 21 as well as its adjacent word line structure 22.

The second material 409 is filled between the second type of bit line structure 232 and its adjacent frame structures 212 in the first direction. An air gap 407 exists between the second material 409 and its adjacent bit line structure 23 as well as its adjacent device structure 21 in the second direction.

In some embodiments, a passivation layer is formed on a surface of the semiconductor structure (the passivation layer is not shown in the drawings of the embodiments of the disclosure).

It should be noted that, according to the embodiments of the disclosure, the semiconductor structure is etched on the basis that the bit line structures, word line structures and device structures are already formed. The first material located between the bit line structure and its adjacent bit line structure, its adjacent device structure as well as its adjacent word line structure is removed by forming etched holes at some of the bit line structures and etching with the etched holes. In this case, the passivation layer on the surface of the semiconductor structure still exists. As a result, parasitic capacitance of the bit line can be reduced and sensing margin of a device can be improved. Moreover, the semiconductor structure can be protected.

Embodiments of the disclosure provide the semiconductor structure, which includes: the substrate; and the plurality of device structures, the plurality of bit line structures and the plurality of word line structures formed on the substrate. The device structure extends in the first direction, and the word line structure extends in the second direction, and the bit line structure extends in the third direction. The device structure includes the capacitor area and the active area. The bit line structure is electrically connected to the active areas arranged in the third direction. Herein, at least some of the bit line structures are formed with the air gaps around them. In this way, the bit line structures and the frame structures at two sides thereof are used for playing a supporting role, and the frame structures are used as the etching stop layer, the first material located between the bit line structure and its adjacent bit line structure, its adjacent device structure as well as its adjacent word line structure is removed, so that the air gaps are formed at the peripheries of at least some of the bit line structures, thus reducing the parasitic capacitance of the bit line and improving the sensing margin of the device.

In another embodiment of the disclosure, referring to FIG. 4, it is shown a schematic flowchart of a method for manufacturing a semiconductor structure provided by embodiments of the disclosure. As shown in FIG. 4, the method may include the following operations.

At S301, a substrate is provided.

It should be noted that, the method provided by the embodiments of the disclosure is applied to manufacturing the aforementioned semiconductor structure 200, and the semiconductor structure 200 can be applied in a DRAM, for example, a 3D DRAM.

When manufacturing the semiconductor structure 200, the substrate is first provided. The substrate may be a silicon substrate or may include other semiconductor elements, for example, germanium (Ge), or may include a semiconductor compound, for example, silicon carbide (SiC), gallium arsenide (GaAs), gallium phosphide (GaP), indium phosphide (InP), indium arsenide (InAs) or indium antimonide (InSb), or may include other semiconductor alloys, for example, silicon germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), gallium indium arsenide phosphide (GaInAsP), or combinations thereof. The embodiments of the disclosure are not specifically limited to this.

At S302, a plurality of device structures, a plurality of bit line structures and a plurality of word line structures are formed on the substrate. There is a first material between the bit line structures, the device structures, the word line structures. Herein, the device structure extends in a first direction, and the word line structure extends in a second direction, and the bit line structure extends in a third direction. The device structure includes a capacitor area and an active area. The bit line structure is electrically connected to the active areas arranged in the third direction.

It should be noted that, after the substrate is provided, the substrate can be pre-cleaned first, and then a stacked structure can be formed on the substrate. The stacked structure includes at least one stacked layer.

In some embodiments, after the substrate is provided, the method further includes the following operations.

A stacked structure is formed on the substrate. Herein, each stacked layer of the stacked structure includes a sacrificial layer and a silicon layer.

A plurality of silicide regions arranged in the second direction are formed in the silicon layer.

The plurality of bit line structures are formed based on the plurality of silicide regions. The bit line structure penetrates through the silicide regions of respective stacked layers in sequence in the third direction.

It should be noted that, each stacked layer includes a sacrificial layer and a silicon layer, and the silicon layer is formed on the sacrificial layer. Specifically, an operation of forming the sacrificial layer and the silicon layer on the substrate is repeated, until a desired number of stacked layers are obtained. In practical applications, the number of the stacked layers may be any desired number, which is not limited in the embodiments of the disclosure.

It should be noted that, a material of the sacrificial layer may be silicon germanium (SiGe), and a material of the silicon layer may be polysilicon. The sacrificial layer and the silicon layer can be formed by any of the following deposition processes: an epitaxial process, a chemical vapor deposition (CVD) process, a physical vapor deposition (PVD) process, an atomic layer deposition process, a spin coating process, a coating process, a thin-film process or the like. For example, the sacrificial layer and the silicon layer can be formed on the semiconductor substrate in sequence by the epitaxial process.

In some embodiments, after the plurality of silicide regions arranged in the second direction are formed in the silicon layers, the method further includes the following operation.

A pair of frame structures is formed at either side of the silicide region in the first direction, respectively, and the word line structure is formed between the pair of frame structures.

A plurality of frame structures arranged in succession in the third direction are provided at a first side of the bit line structures, and another plurality of frame structures arranged in succession in the third direction are provided at a second side of the bit line structures.

Herein, the first side and the second side are opposite in the first direction.

It should be noted that, a material of the frame structure may be silicon nitride (SiN). As shown in FIG. 2, three frame structures 212 arranged in succession in the third direction are provided at each of the first side and the second side of the bit line structures 23.

It should be noted that, there are many possible orders of forming the plurality of device structures, the plurality of word line structures and the plurality of bit line structures on the substrate, depending on the actually selected process. Referring to FIG. 13 to FIG. 29 below, a method for forming the plurality of device structures, the plurality of word line structures and the plurality of bit line structures is illustratively provided.

At S303, the first material located between the bit line structure and its adjacent bit line structure, its adjacent device structure as well as its adjacent word line structure is removed, so that air gaps are formed at peripheries of at least some of the bit line structures.

It should be noted that, in order to etch the first material located between the bit line structure and its adjacent bit line structure, its adjacent device structure as well as its adjacent word line structure, a protective layer is formed on the stacked structure, and then the protective layer is etched to form at least one etched hole.

In some embodiments, etching the first material located between the bit line structure and its adjacent bit line structure, its adjacent device structure as well as its adjacent word line structure includes the following operations.

A protective layer is formed on the stacked structure.

The protective layer is etched to form at least one etched hole. Herein, the etched hole covers the bit line structure and frame structures at the two sides of the bit line structure.

The air gaps are formed by etching with the etched hole.

Herein, a width of the etched hole in the first direction has a first value, and widths of the bit line structure and the frame structures at two sides thereof in the first direction have a second value. The first value is greater than the second value.

Figure 5:
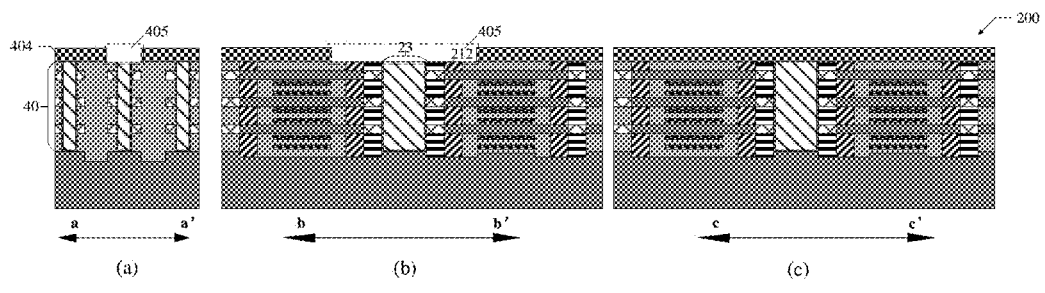
FIG. 5 is a first schematic diagram during manufacturing a semiconductor structure provided by embodiments of the disclosure.

It should be noted that, referring to FIG. 5, a schematic diagram 1 during manufacturing a semiconductor structure provided by embodiments of the disclosure is shown. In FIG. 5, and also in FIG. 6 to FIG. 12, each (a) is a cross-section diagram along a-a' shown in FIG. 1A or FIG. 1B, and each (b) is a cross-section diagram along b-b' shown in FIG. 1A or FIG. 1B, and each (c) is a cross-section diagram along c-c' shown in FIG. 1A or FIG. 1B. As shown in FIG. 5, a protective layer 404 is first formed on the stacked structure 40, and then the protective layer 404 is etched to form an etched hole 405. Then, the stacked structure 40 is etched with the etched hole 405 to form the air gaps.

It should be noted that, a material of the protective layer 404 may be silicon oxynitride (SION) or other materials, which is not specifically limited.

It should be noted that, the protective layer 404 may be etched by a dry etching process or a wet etching process. A gas adopted for the dry etching process may be one of trifluoromethane ($CHF_3$), carbon tetrafluoride ($CF_4$), difluoromethane ($CH_2F_2$), hydrobromic acid (HBr), chlorine ($Cl_2$) or sulfur hexafluoride ($SF_6$), or any combination thereof. The wet etching process may be performed with concentrated sulfuric acid, hydrofluoric acid, concentrated nitric acid and other strong acids.

It should be noted that, as shown in FIG. 5, a width of the etched hole 405 in the first direction is greater than widths of the bit line structure 23 and the frame structures 212 at two sides thereof in the first direction. A width of the etched hole 405 in the second direction is greater than a width of the bit line structure 23 in the second direction.

In a specific example, forming the air gaps by etching with the etched hole includes the following operations.

A complete etching is performed in the third direction along the etched hole to form a first trench. Herein, the complete etching is used for removing the frame structures, the bit line structure and the filled first material located under the etched hole.

A lateral etching is performed in a direction perpendicular to the third direction with the first trench to form the air gaps. Herein, in the first direction, the first material is etched outward relative to sidewalls of the first trench, and the etching of the first material is stopped at adjacent frame structures of the first trench. In the second direction, the air gaps are allowed to communicate with each other.

A dummy structure is formed in the first trench and the air gaps are retained.

It should be noted that, the direction perpendicular to the third direction refers to a plane direction defined by the first direction and the second direction.

Figure 6:
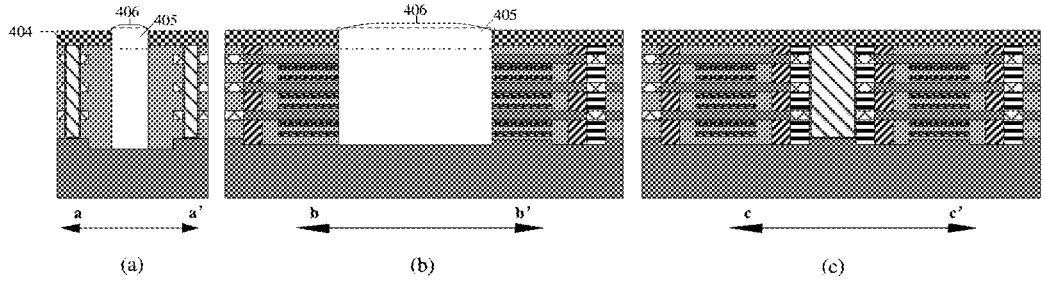
FIG. 6 is a second schematic diagram during manufacturing a semiconductor structure provided by embodiments of the disclosure.

On the basis of FIG. 5, referring to FIG. 6, a schematic diagram 2 during manufacturing a semiconductor structure provided by embodiments of the disclosure is shown. As shown in FIG. 6, for the complete etching, after the etched hole 405 is formed, the complete etching is performed in the third direction along the etched hole 405 to form the first trench 406.

It should be noted that, as shown in FIG. 6, the frame structures, the bit line structure, the silicon layers, a metal material and the filled first material located under the etched hole 405 are removed by the complete etching.

It should be noted that, the complete etching may be performed by a plasma etching process. The plasma etching process is a dry etching technology using plasma, and a high pressure and a low radio-frequency power are usually used in the process. Atoms or molecules in a surface layer of a chip contact and react with active atoms in the plasma atmosphere, to form gaseous products which leave a crystal plane and cause the etching.

Figure 7:
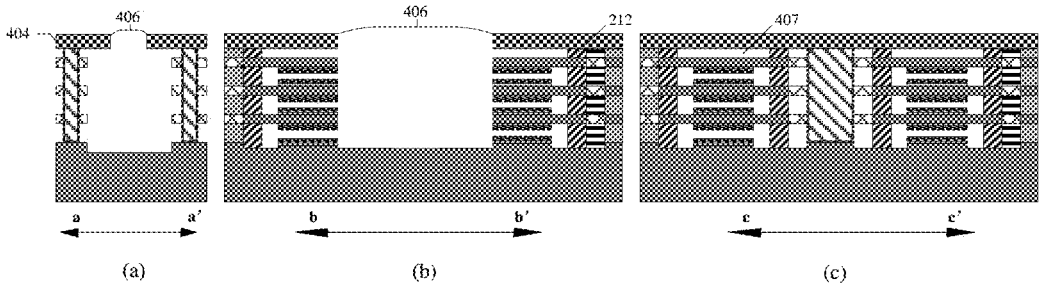
FIG. 7 is a third schematic diagram during manufacturing a semiconductor structure provided by embodiments of the disclosure.

On the basis of FIG. 6, referring to FIG. 7, a schematic diagram 3 during manufacturing a semiconductor structure provided by embodiments of the disclosure is shown. As shown in FIG. 7, after the first trench 406 is formed, a lateral etching is performed in the direction perpendicular to the third direction with the first trench 406 to form the air gaps 407.

It should be noted that, as shown in FIG. 7, performing the lateral etching in the direction perpendicular to the third direction with the first trench 406 is that silicon oxide of the first material is etched outward relative to the sidewalls of the first trench in the first direction, and the etching of the first material is stopped at adjacent frame structures 212 of the first trench 406; and in the second direction, the air gaps 407 are allowed to communicate with each other.

Figure 8:
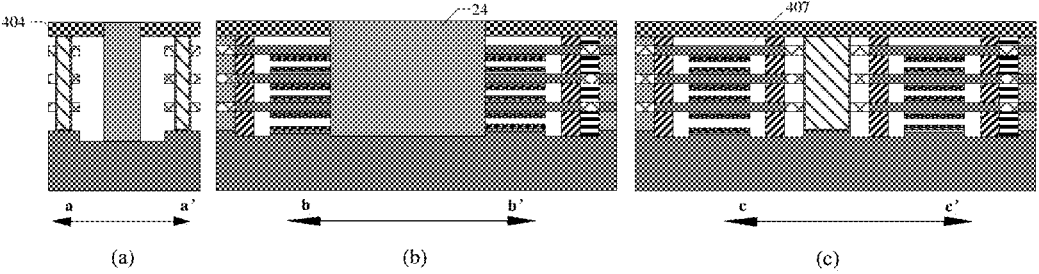
FIG. 8 is a fourth schematic diagram during manufacturing a semiconductor structure provided by embodiments of the disclosure.

On the basis of FIG. 7, referring to FIG. 8, a schematic diagram 4 during manufacturing a semiconductor structure provided by embodiments of the disclosure is shown. As shown in FIG. 8, after the air gaps 407 are formed, a dummy structure 24 is formed in the first trench 406 and the air gaps 407 are retained.

In some embodiments, forming the dummy structure in the first trench includes the following operation.

A second material is filled into the first trench to form the dummy structure.

Herein, a width of the dummy structure in the first direction has a first value.

It should be noted that, the second material can be filled into the first trench by a physical vapor deposition process, or other deposition processes, which is not specifically limited.

It should be noted that, as shown in FIG. 8, a width of the dummy structure 24 in the first direction is greater than widths of the bit line structure and the frame structures at two sides thereof in the first direction.

In some embodiments, the first material includes a low dielectric constant material (i.e. low K, where K is a dielectric constant of a material), silicon oxide or silicon nitride, and the second material includes silicon oxide.

In another specific example, forming the air gaps by etching with the etched hole includes the following operations.

A partial etching is performed in the third direction along the etched hole to form an etched gap. Herein, the partial etching is used for removing the filled first material and retaining the frame structures and the bit line structure.

A lateral etching is performed in a direction perpendicular to the third direction with the etched gap to form the air gaps. Herein, in the first direction, the first material is etched outward relative to sidewalls of the etched gap, and the etching of the first material is stopped at adjacent frame structures of the etched gap. In the second direction, the air gaps are allowed to communicate with each other.

Figure 9:
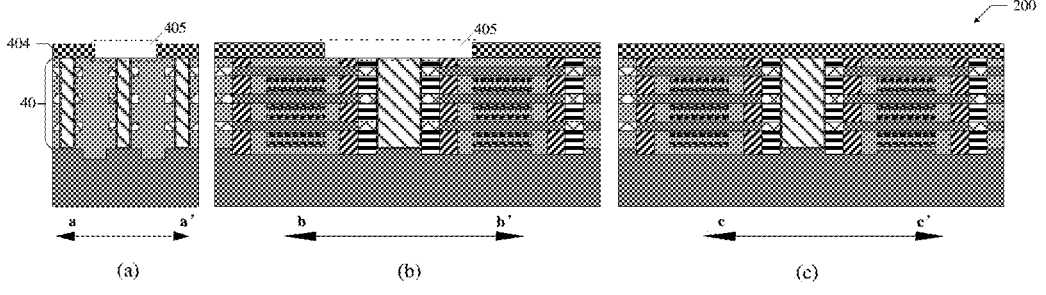
FIG. 9 is a fifth schematic diagram during manufacturing a semiconductor structure provided by embodiments of the disclosure.

It should be noted that, referring to FIG. 9, a schematic diagram 5 during manufacturing a semiconductor structure provided by embodiments of the disclosure is shown. As shown in FIG. 9, a protective layer 404 is first formed on the stacked structure 40, and then the protective layer 404 is etched to form an etched hole 405. Then the stacked structure 40 is etched with the etched hole 405 to form the air gaps.

Figure 10:
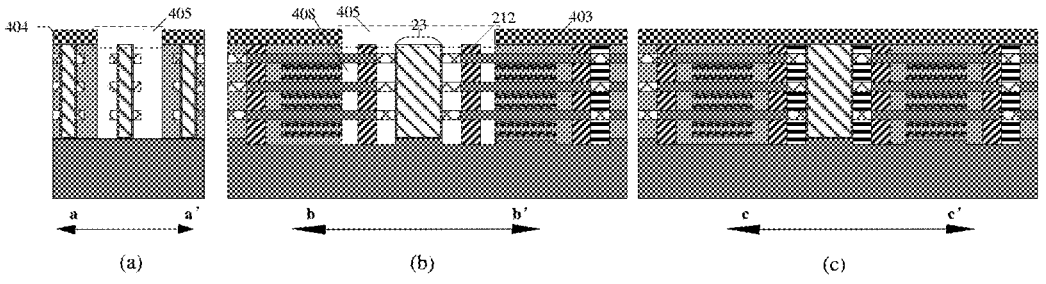
FIG. 10 is a sixth schematic diagram during manufacturing a semiconductor structure provided by embodiments of the disclosure.

On the basis of FIG. 9, referring to FIG. 10, a schematic diagram 6 during manufacturing a semiconductor structure provided by embodiments of the disclosure is shown. As shown in FIG. 10, for the partial etching, after the etched hole 405 is formed, the partial etching is performed in the third direction along the etched hole 405 to form an etched gap 408.

It should be noted that, as shown in FIG. 10, only the filled first material including the low dielectric constant material, silicon oxide or silicon nitride is removed by the partial etching, while the frame structures 212, the bit line structure 23, the silicon layers 403, a metal material and so on located under the etched hole 405 are retained.

Figure 11:
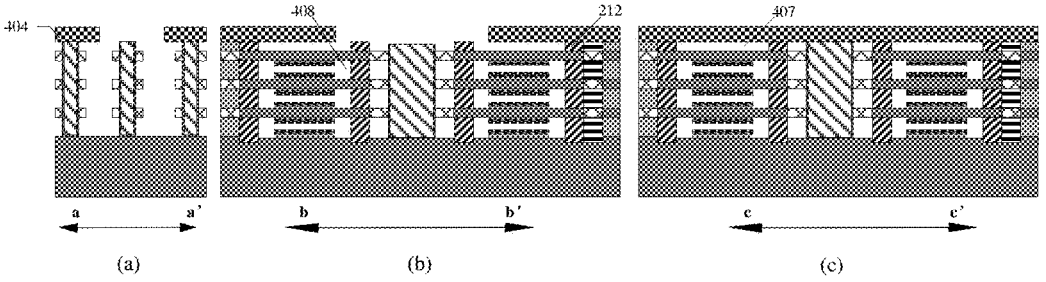
FIG. 11 is a seventh schematic diagram during manufacturing a semiconductor structure provided by embodiments of the disclosure.

On the basis of FIG. 10, referring to FIG. 11, a schematic diagram 7 during manufacturing a semiconductor structure provided by embodiments of the disclosure is shown. As shown in FIG. 11, after the etched gap 408 is formed, a lateral etching is performed in a direction perpendicular to the third direction with the etched gap 408 to form the air gaps 407.

It should be noted that, as shown in FIG. 11, performing the lateral etching in the direction perpendicular to the third direction with the etched gap 408 is that silicon oxide of the first material is etched outward relative to sidewalls of the etched gap in the first direction, and the etching of the first material is stopped at adjacent frame structures 212 of the etched gap 408; and in the second direction, the air gaps 407 are allowed to communicate with each other.

Figure 12:
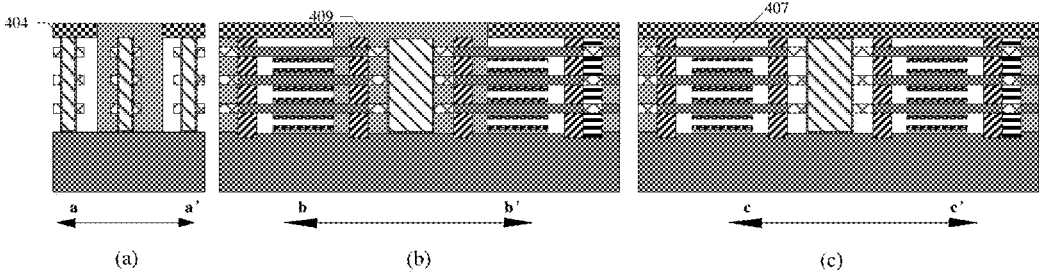
FIG. 12 is an eighth schematic diagram during manufacturing a semiconductor structure provided by embodiments of the disclosure.

On the basis of FIG. 11, referring to FIG. 12, a schematic diagram 8 during manufacturing a semiconductor structure provided by embodiments of the disclosure is shown. As shown in FIG. 12, after forming the air gaps 407, a second material is filled into the etched gap 408. Herein, the second material may be silicon oxide 409.

In this way, the bit line structure and the frame structures at two sides thereof are used for playing a supporting role, and the frame structures are used as an etching stop layer, and the first material located between the bit line structure and its adjacent bit line structure, its adjacent device structure as well as its adjacent word line structure is removed, so that the air gaps are formed at peripheries of at least some of the bit line structures, thus reducing parasitic capacitance of a bit line and improving sensing margin of a device.

In addition, a method for forming the device structures, the word line structures and the bit line structures is illustratively provided.

Figure 13:
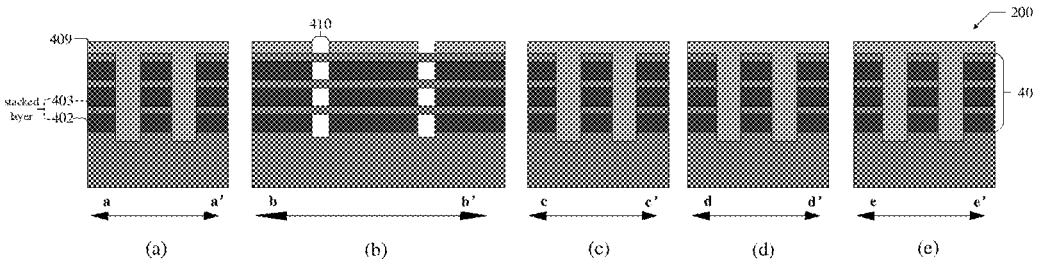
FIG. 13 is a ninth schematic diagram during manufacturing a semiconductor structure provided by embodiments of the disclosure.

It should be noted that, referring to FIG. 13, a schematic diagram 9 during manufacturing a semiconductor structure provided by embodiments of the disclosure is shown. In FIG. 13, and also in FIG. 14 to FIG. 29, each (a) is a cross-section diagram along a-a' shown in FIG. 3, and each (b) is a cross-section diagram along b-b' shown in FIG. 3, and each (c) is a cross-section diagram along c-c' shown in FIG. 3, and each (d) is a cross-section diagram along d-d' shown in FIG. 3, and each (e) is a cross-section diagram along e-e' shown in FIG. 3. As shown in FIG. 13, part of silicon oxide (SiO) 409 on a surface of a stacked structure 40 is first etched, and then part of a sacrificial layer 402 is removed by selectively etching to form a second trench 410. Since the sacrificial layer 402 has a greater etching selection ratio than the silicon layer 403, that is, the sacrificial layer 402 is easier to be removed by etching than the silicon layer 403 under a same etching condition. As a result, the sacrificial layer 402 can be removed without damaging the silicon layer 403.

Figure 14:
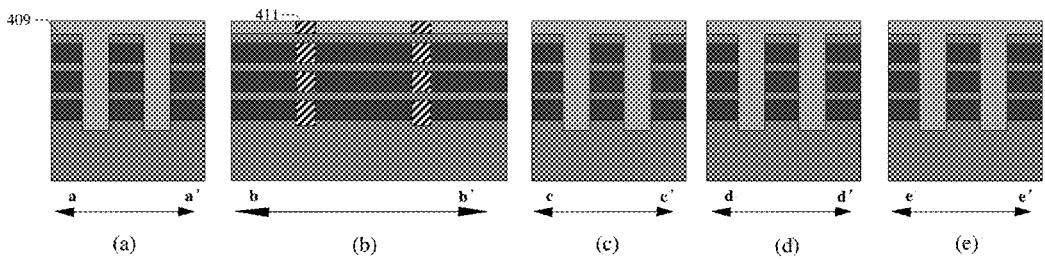
FIG. 14 is a tenth schematic diagram during manufacturing a semiconductor structure provided by embodiments of the disclosure.

On the basis of FIG. 13, referring to FIG. 14, a schematic diagram 10 during manufacturing a semiconductor structure provided by embodiments of the disclosure is shown. As shown in FIG. 14, after the second trench 410 is formed, silicon nitride 411 is filled into the second trench 410 to form the frame structures 212 subsequently. Herein, a process for filling the silicon nitride 411 may be an atomic layer deposition process or other deposition processes, which is not specifically limited.

It should be noted that, as shown in FIG. 14, after the second trench 410 is filled, a chemical mechanical polishing (CMP) can also be performed on a surface of a semiconductor structure 200 to flatten a top surface of the semiconductor structure 200.

Figure 15:
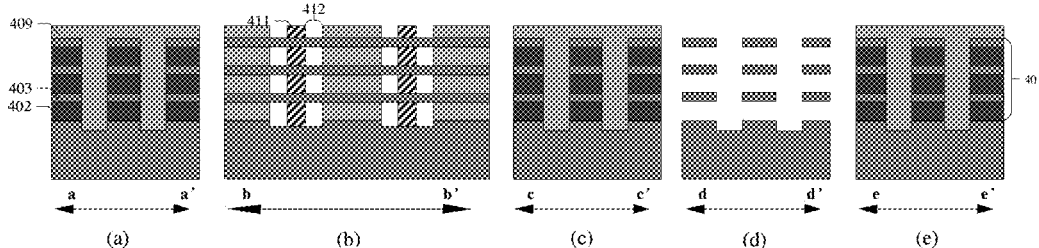
FIG. 15 is an eleventh schematic diagram during manufacturing a semiconductor structure provided by embodiments of the disclosure.

On the basis of FIG. 14, referring to FIG. 15, a schematic diagram 11 during manufacturing a semiconductor structure provided by embodiments of the disclosure is shown. As shown in FIG. 15, another part of the silicon oxide 409 on the surface of the stacked structure 40 is first etched, and then another part of the sacrificial layer 402 is removed by selectively etching, to form third trenches 412 on both sides of the deposited silicon nitride 411.

Figure 16:
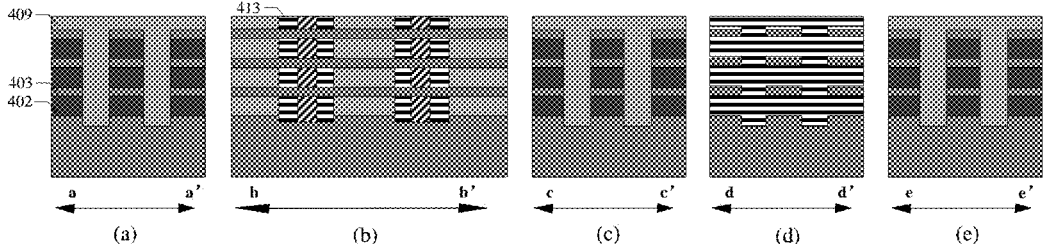
FIG. 16 is a twelfth schematic diagram during manufacturing a semiconductor structure provided by embodiments of the disclosure.

On the basis of FIG. 15, referring to FIG. 16, a schematic diagram 12 during manufacturing a semiconductor structure provided by embodiments of the disclosure is shown. It should be noted that, as shown in FIG. 16, after the third trenches 412 are formed, a low dielectric constant material 413 is filled into the third trenches 412. After the low dielectric constant material 413 is filled, a chemical mechanical polishing (CMP) can also be performed on the surface of the semiconductor structure 200 to flatten the top surface of the semiconductor structure 200.

Figure 17:
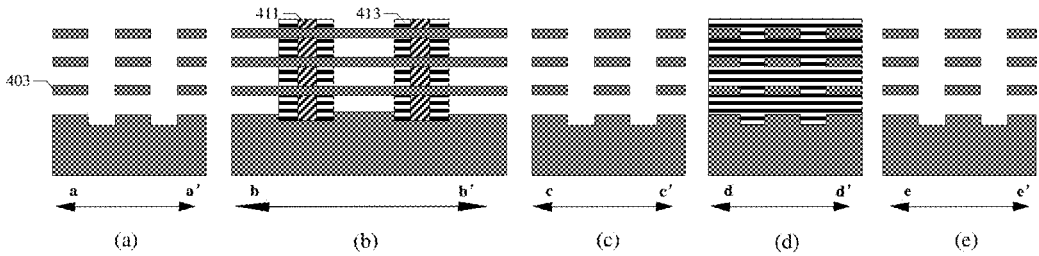
FIG. 17 is a thirteenth schematic diagram during manufacturing a semiconductor structure provided by embodiments of the disclosure.

On the basis of FIG. 16, referring to FIG. 17, a schematic diagram 13 during manufacturing a semiconductor structure provided by embodiments of the disclosure is shown. As shown in FIG. 17, after filling the low dielectric constant material 413, the silicon oxide 409 of the semiconductor structure 200 is completely etched first, and then the sacrificial layer 402 of the semiconductor structure 200 is completely etched.

Figure 18:
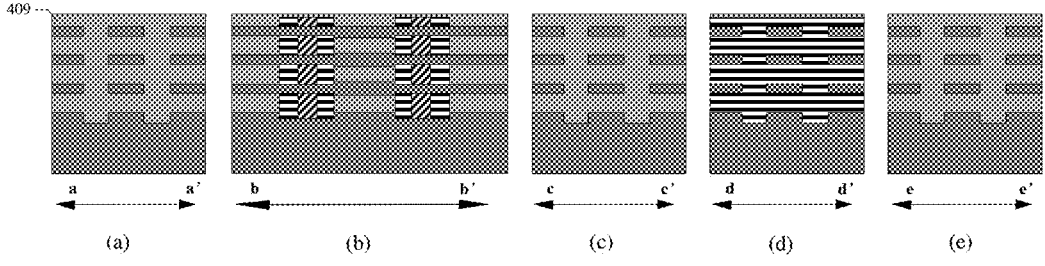
FIG. 18 is a fourteenth schematic diagram during manufacturing a semiconductor structure provided by embodiments of the disclosure.

On the basis of FIG. 17, referring to FIG. 18, a schematic diagram 14 during manufacturing a semiconductor structure provided by embodiments of the disclosure is shown. As shown in FIG. 18, after the semiconductor structure 200 shown in FIG. 17 is formed, a spin-on dielectric (SOD) is first filled into the semiconductor structure 200, in which the spin-on dielectric can be the silicon oxide 409; and then the semiconductor structure 200 filled with the silicon oxide 409 is heated to make it dense; and a chemical mechanical polishing is performed on the surface of semiconductor structure 200 to reduce a thickness.

Figure 19:
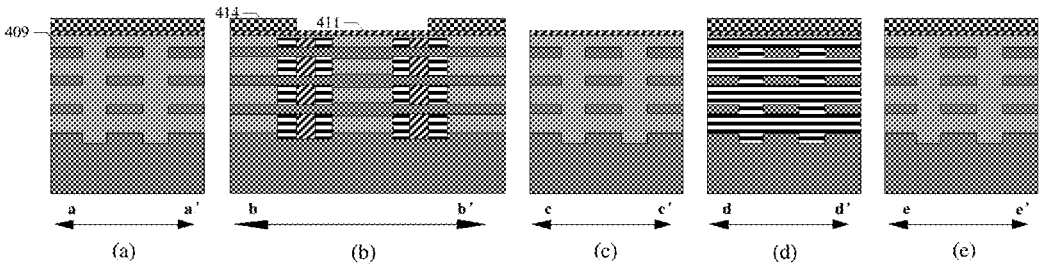
FIG. 19 is a fifteenth schematic diagram during manufacturing a semiconductor structure provided by embodiments of the disclosure.

On the basis of FIG. 18, referring to FIG. 19, a schematic diagram 15 during manufacturing a semiconductor structure provided by embodiments of the disclosure is shown. As shown by FIG. 19, after the silicon oxide 409 is filled, silicon nitride 411 is first deposited on the surface of the semiconductor structure 200; and then a first photoresist layer 414 is formed on a surface of the silicon nitride 411. The first photoresist layer 414 has a first pattern including a pattern required to remove part of the silicon nitride 411.

Figure 20:
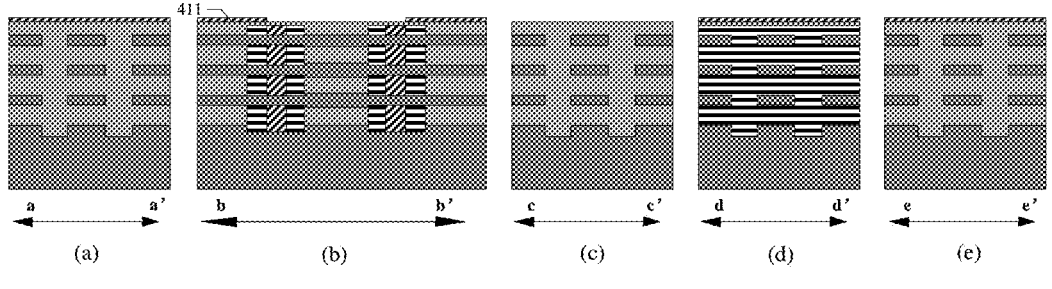
FIG. 20 is a sixteenth schematic diagram during manufacturing a semiconductor structure provided by embodiments of the disclosure.

On the basis of FIG. 19, referring to FIG. 20, a schematic diagram 16 during manufacturing a semiconductor structure provided by embodiments of the disclosure is shown. As shown in FIG. 20, after the first photoresist layer 414 is formed, the first pattern is transferred to the surface of the silicon nitride 411, and the first photoresist layer 414 is removed, and then the part of the silicon nitride 411 is removed.

It should be noted that, as shown in the FIG. 20, the first photoresist layer 414 may be removed by etching, and the first pattern may also be transferred to the surface of the silicon nitride 411 by etching.

Figure 21:
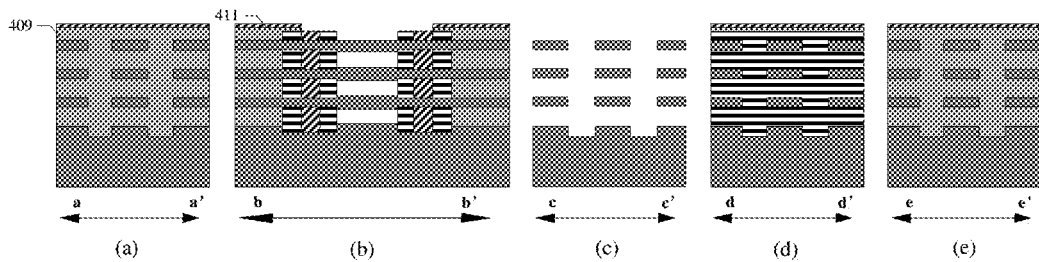
FIG. 21 is a seventeenth schematic diagram during manufacturing a semiconductor structure provided by embodiments of the disclosure.

On the basis of FIG. 20, referring to FIG. 21, a schematic diagram 17 during manufacturing a semiconductor structure provided by embodiments of the disclosure is shown. As shown in FIG. 21, after the part of the silicon nitride 411 is removed, the silicon oxide 409 not covered by the silicon nitride 411 is etched and removed to form word line structures 22 subsequently.

Figure 22:
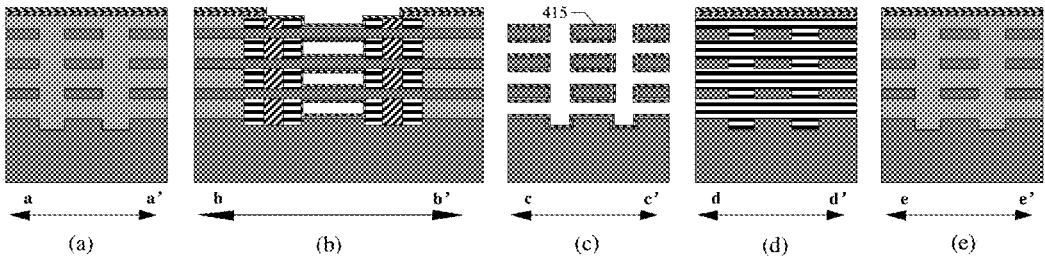
FIG. 22 is an eighteenth schematic diagram during manufacturing a semiconductor structure provided by embodiments of the disclosure.

On the basis of FIG. 21, referring to FIG. 22, a schematic diagram 18 during manufacturing a semiconductor structure provided by embodiments of the disclosure is shown. As shown in FIG. 22, after the silicon oxide 409 not covered by the silicon nitride 411 is removed by etching, titanium nitride (TiN) 415 is deposited in the semiconductor structure 200 to form gate-all-around structures subsequently. Herein, a process for depositing the titanium nitride 415 may be an atomic layer deposition process or other deposition processes, which is not specifically limited.

Figure 23:
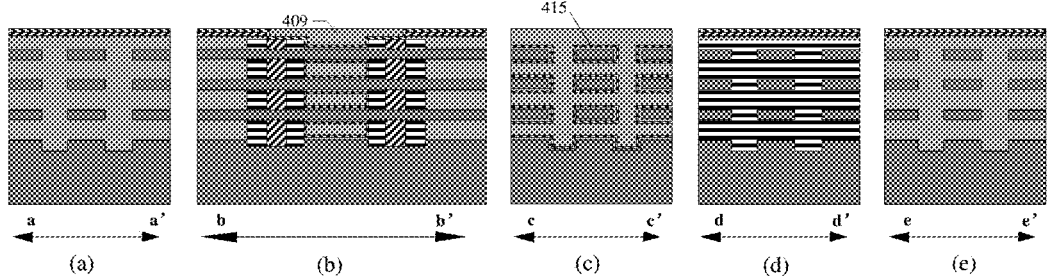
FIG. 23 is a nineteenth schematic diagram during manufacturing a semiconductor structure provided by embodiments of the disclosure.

On the basis of FIG. 22, referring to FIG. 23, a schematic diagram 19 during manufacturing a semiconductor structure provided by embodiments of the disclosure is shown. As shown in FIG. 23, after the titanium nitride 415 is deposited, silicon oxide 409 is deposited in the semiconductor structure 200; and after the silicon oxide 409 is deposited, a chemical mechanical polishing (CMP) can also be performed on the surface of the semiconductor structure 200 to flatten the top surface of the semiconductor structure 200.

Figure 24:
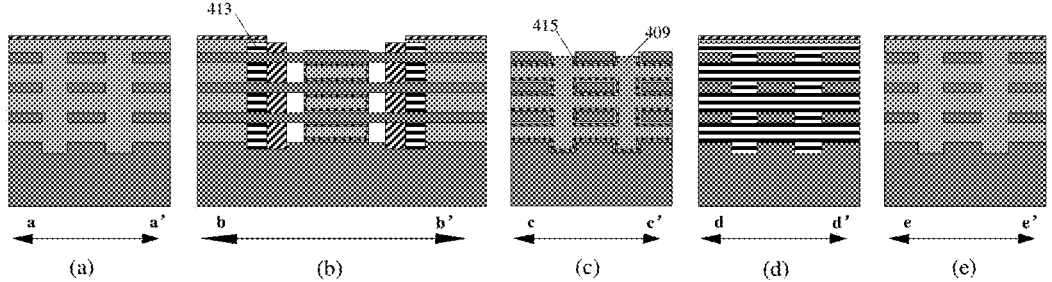
FIG. 24 is a twentieth schematic diagram during manufacturing a semiconductor structure provided by embodiments of the disclosure.

On the basis of FIG. 23, referring to FIG. 24, a schematic diagram 20 during manufacturing a semiconductor structure provided by embodiments of the disclosure is shown. As shown in FIG. 24, after the silicon oxide 409 is deposited, part of the titanium nitride 415, part of the low dielectric constant material 413 and part of the silicon oxide 409 of the semiconductor structure are etched.

Figure 25:
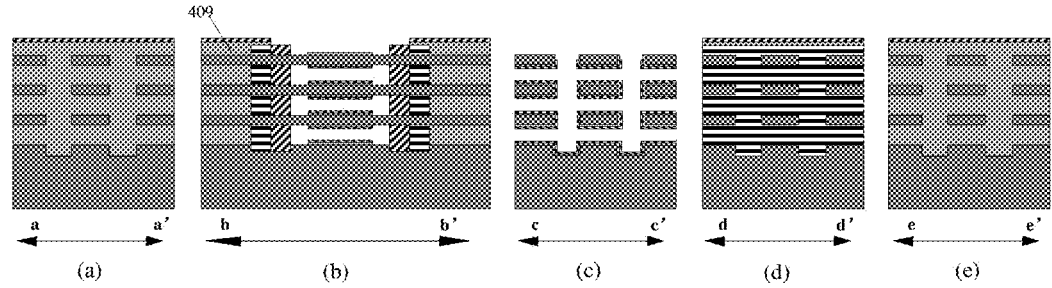
FIG. 25 is a twenty-first schematic diagram during manufacturing a semiconductor structure provided by embodiments of the disclosure.

On the basis of FIG. 24, referring to FIG. 25, a schematic diagram 21 during manufacturing a semiconductor structure provided by embodiments of the disclosure is shown. As shown in FIG. 25, after the parts of the materials are etched, the silicon oxide 409, where the gate-all-around structures are formed, is etched.

Figure 26:
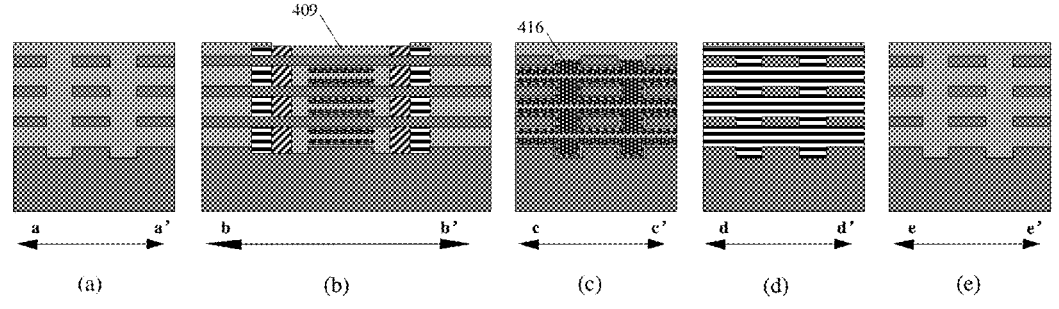
FIG. 26 is a twenty-second schematic diagram during manufacturing a semiconductor structure provided by embodiments of the disclosure.

On the basis of FIG. 25, referring to FIG. 26, a schematic diagram 22 during manufacturing a semiconductor structure provided by embodiments of the disclosure is shown. As shown in FIG. 26, after the silicon oxide 409, where the gate-all-around structures are formed, is etched, tetraethyl orthosilicate (TEOS) 416 is deposited on sidewalls of the gate-all-around structures, and then silicon oxide 409 is deposited in the semiconductor structure 200, and the silicon nitride 411 on the surface of the semiconductor structure 200 is removed.

Figure 27:
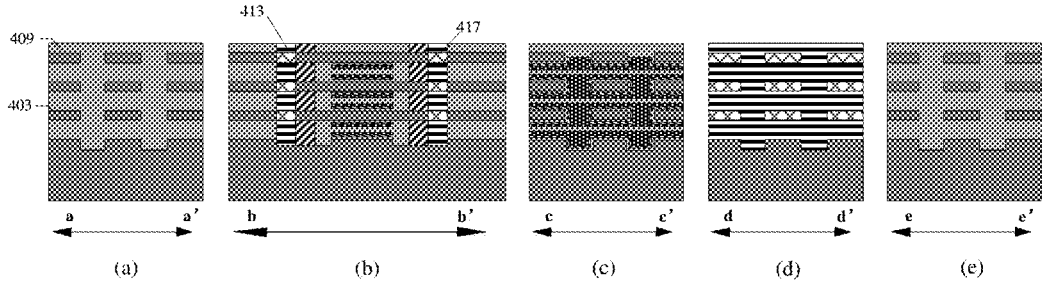
FIG. 27 is a twenty-third schematic diagram during manufacturing a semiconductor structure provided by embodiments of the disclosure.

On the basis of FIG. 26, referring to FIG. 27, a schematic diagram 23 during manufacturing a semiconductor structure provided by embodiments of the disclosure is shown. As shown in FIG. 27, after the silicon nitride 411 on the surface of the semiconductor structure 200 is removed, the silicon oxide 409 protruding from the surface of the semiconductor structure 200 is first removed by a chemical mechanical polishing process. Then, the low dielectric constant material 413 of the semiconductor structure 200 is removed. Then, a metal material is deposited, and part of the silicon layer 403 is subject to a metal siliconization process to form a silicide region 417. Then, the semiconductor structure 200 is subject to a rapid thermal processing (RTP). Finally, a low dielectric constant material 413 is deposited.

It should be noted that, the deposited metal material may be a metal material with a small resistance and a good electrical conductivity, such as cobalt (Co), titanium (Ti), nickel (Ni), or other metal materials, which is not specifically limited.

Figure 28:
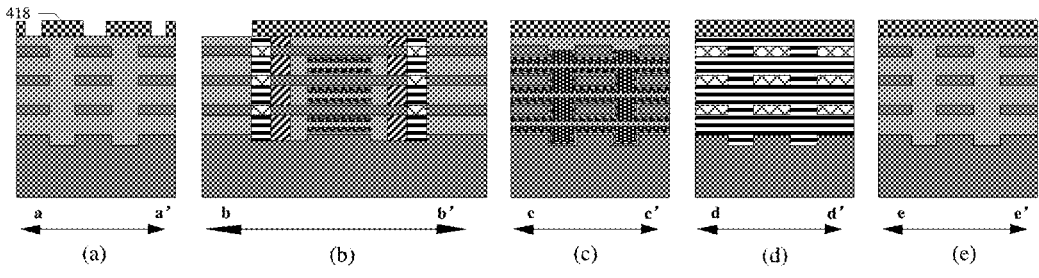
FIG. 28 is a twenty-fourth schematic diagram during manufacturing a semiconductor structure provided by embodiments of the disclosure.

On the basis of FIG. 27, referring to FIG. 28, a schematic diagram 24 during manufacturing a semiconductor structure provided by embodiments of the disclosure is shown. As shown in FIG. 28, after the semiconductor structure 200 shown in FIG. 27 is formed, a second photoresist layer 418 is formed on the surface of the semiconductor structure 200. The second photoresist layer 418 has a second pattern including a pattern required to form the bit line structures 23. A material of the second photoresist layer 418 and a material of the first photoresist layer 414 may be the same, so that the second photoresist layer 418 and the first photoresist layer 414 may be represented with a same filling shape in the drawings.

It should be noted that, as shown in FIG. 28, a width of gaps in the second photoresist layer 418 may be 40 nanometers (nm), that is, a width of the bit line structure 23 in the first direction may be 40 nanometers, and the gaps may be formed at intervals of 50 nanometers.

Figure 29:
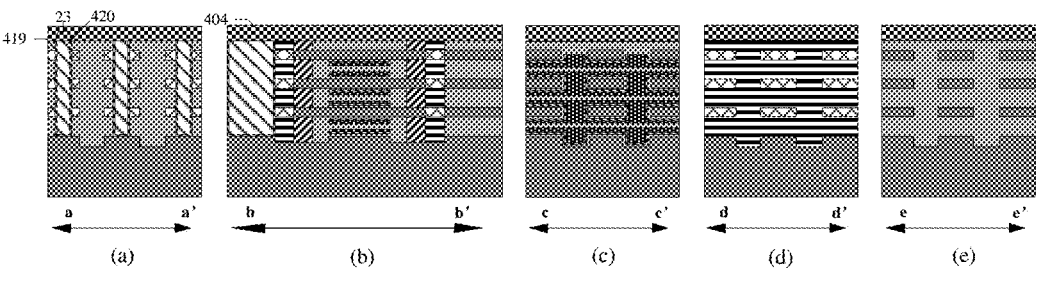
FIG. 29 is a twenty-fifth schematic diagram during manufacturing a semiconductor structure provided by embodiments of the disclosure.

On the basis of FIG. 28, referring to FIG. 29, a schematic diagram 25 during manufacturing a semiconductor structure provided by embodiments of the disclosure is shown. As shown in FIG. 29, after the second photoresist layer 418 is formed, the second pattern is first transferred to the surface of the semiconductor structure 200 and the second photoresist layer 418 is removed to obtain a trench for forming the bit line structure 23. Then, a barrier layer outer wall 419 is formed in the trench for forming the bit line structure 23. Then, a metal material 420 is filled in hollow spaces defined by the barrier layer outer wall 419 to form the bit line structures 23. After the bit line structures 23 are formed, a protective layer 404 is deposited on the surface of the semiconductor structure 200.

It should be noted that, as shown in FIG. 29, a material of the barrier layer outer wall 419 may include titanium nitride, while the metal material 420 may include cobalt (Co), copper (Cu), aluminum (Al), etc., and a material for forming the bit line structure 23 may be a combination of titanium nitride and tungsten, or a combination of other materials, which are not specifically limited in the embodiments of the disclosure.

The embodiments of the disclosure provide the method for manufacturing a semiconductor structure. In the method, the substrate is first provided; then, the plurality of device structures, the plurality of bit line structures and the plurality of word line structures are formed on the substrate, in which there is the first material between the bit line structures, the device structures, the word line structures. Herein, the device structure extends in the first direction, and the word line structure extends in the second direction, and the bit line structure extends in the third direction. The device structure includes a capacitor area and an active area. The bit line structure is electrically connected to the active areas arranged in the third direction. Finally, the first material between the bit line structure and its adjacent bit line structure, its adjacent device structure and its adjacent word line structure is removed by etching to form the air gaps around at least some of the bit line structures. In this way, the bit line structures and the frame structures at the two sides thereof are used for playing the supporting role, and the frame structures are used as the etching stop layer, and the first material located between the bit line structure and its adjacent bit line structure, its adjacent device structure as well as its adjacent word line structure is removed, so that the air gaps are formed at the peripheries of at least some of the bit line structures, thus reducing the parasitic capacitance of the bit line and improving the sensing margin of the device.

Figure 30:
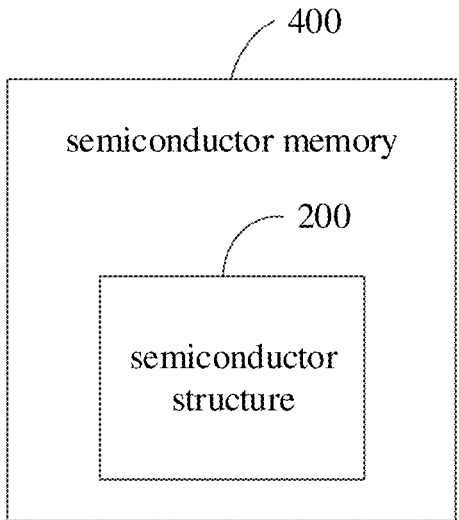
FIG. 30 is a schematic structural diagram of a semiconductor memory provided by embodiments of the disclosure.

In yet another embodiment of the disclosure, referring to FIG. 30, a schematic structural diagram of a semiconductor memory 400 provided by embodiments of the disclosure is shown. As shown in FIG. 30, the semiconductor memory 400 includes the semiconductor structure 200 described in any of the previous embodiments.

In some embodiments, the semiconductor memory 400 may be a 3D DRAM.

For the semiconductor memory 400, it includes the semiconductor structure 200 described in the previous embodiments. The semiconductor structure 200 includes: a substrate; and a plurality of device structures, a plurality of bit line structures and a plurality of word line structures formed on the substrate. The device structure extends in a first direction, and the word line structure extends in a second direction, and the bit line structure extends in a third direction. The device structure includes a capacitor area and an active area. The bit line structure is electrically connected to the active areas arranged in the third direction. Herein, air gaps are formed at peripheries of at least some of the bit line structures. In this way, the bit line structures and frame structures at two sides thereof are used for playing a supporting role, and the frame structures are used as an etching stop layer, and the first material located between the bit line structure and its adjacent bit line structure, its adjacent device structure as well as its adjacent word line structure is removed, so that the air gaps are formed at the peripheries of at least some of the bit line structures, thus reducing parasitic capacitance of a bit line and improving sensing margin of a device.

Details not disclosed in this embodiment of the disclosure can be understood with reference to the description of the preceding embodiments.

The above are only the preferred embodiments of this disclosure, and are not intended to limit the protection scope of the disclosure.

It should be noted that in this disclosure, the term "include", "comprise" or any other variant thereof is intended to cover non-exclusive inclusion, so that a procedure, method, article or device that includes a series of elements not only includes those elements, but also includes other elements not explicitly listed, or also includes elements inherent to such procedure, method, article or device. Without further restrictions, the element defined by the statement "including one . . . " does not exclude the existence of another identical element in the procedure, method, article or device that includes the element.

The serial numbers of the above disclosed embodiments are only for description, and do not represent the advantages and disadvantages of the embodiments.

The methods disclosed in several method embodiments provided in this disclosure may be arbitrarily combined without conflict to obtain a new method embodiment.

The features disclosed in several product embodiments provided in this disclosure may be arbitrarily combined without conflict to obtain a new product embodiment.

The features disclosed in several method or device embodiments provided by the disclosure may be arbitrarily combined without conflict to obtain a new method embodiment or device embodiment.

The above are only some specific embodiments of the disclosure, but the protection scope of the disclosure is not limited to this. Changes or replacements can be easily thought of by any person skilled in the art and such changes or replacements should be covered by the protection scope of the disclosure. Therefore, the protection scope of the disclosure should be subject to the protection scope of the claims.

What is claimed is:

1. A semiconductor structure, comprising:

a substrate; and a plurality of device structures, a plurality of bit line structures and a plurality of word line structures formed on the substrate, wherein the device structure extends in a first direction, the word line structure extends in a second direction, the bit line structure extends in a third direction, the device structure comprises a capacitor and an active layer, and the bit line structure is electrically connected to the active layers arranged in the third direction, wherein air gaps are formed at peripheries of at least some of the bit line structures;

a frame structure is provided on either side of the word line structure in the first direction, a plurality of the frame structures arranged in succession in the third direction are provided at a first side of the bit line structures, and another plurality of the frame structures arranged in succession in the third direction are provided at a second side of the bit line structures, wherein the first side and the second side are opposite in the first direction; and there are a plurality of bit line regions on the substrate, and some of the bit line regions are provided with the bit line structures and the frame structures located at two sides of the bit line structures, and others of the bit line regions are provided with dummy structures.

2. The semiconductor structure according to claim 1, wherein the dummy structure is formed by filling a second material, and wherein the second material comprises silicon oxide.

3. The semiconductor structure according to claim 2, wherein the bit line structures comprise a first type of bit line structures and a second type of bit line structures, wherein for the first type of bit line structures, in the first direction, the air gap exists between the first type of bit line structure and its adjacent frame structure; and in the second and third directions, the air gap exists between the first type of bit line structure and its adjacent bit line structure, its adjacent device structure, as well as its adjacent word line structure; and wherein for the second type of bit line structures, the second material is filled between the second type of bit line structure and its adjacent frame structure in the first direction; and in the second direction, the air gap exists between the second material and its adjacent bit line structure as well as its adjacent device structure.

4. The semiconductor structure according to claim 1, wherein a passivation layer is formed on a surface of the semiconductor structure.

5. A method for manufacturing a semiconductor structure, comprising:

providing a substrate;

forming a plurality of device structures, a plurality of bit line structures and a plurality of word line structures on the substrate, wherein there is a first material between the bit line structures, the word line structures and the device structures, and wherein the device structure extends in a first direction, and the word line structure extends in a second direction, and the bit line structure extends in a third direction, and the device structure comprises a capacitor and an active layer, and the bit line structure is electrically connected to the active layers arranged in the third direction, and etching the first material located between the bit line structure and its adjacent bit line structure, its adjacent device structure as well as its adjacent word line structure to form air gaps at peripheries of at least some of the bit line structures;

wherein the method further comprises: after providing the substrate, forming a stacked structure on the substrate, wherein each stacked layer of the stacked structure comprises a sacrificial layer and a silicon layer;

forming a plurality of silicide regions arranged in the second direction in the silicon layer;

forming a pair of frame structures at either side of the silicide regions in the first direction;

forming the word line structure between the pair of frame structures;

forming the plurality of bit line structures based on the plurality of silicide regions, wherein the bit line structure penetrates through the silicide regions of respective stacked layers in sequence in the third direction and a plurality of the frame structures arranged in succession in the third direction are provided at a first side of the bit line structures, and another plurality of the frame structures arranged in succession in the third direction are provided at a second side of the bit line structures, wherein the first side and the second side are opposite in the first direction;

wherein the step of etching the first material located between the bit line structure and its adjacent bit line structure, its adjacent device structure as well as its adjacent word line structure comprises:

forming a protective layer on the stacked structure, etching the protective layer to form at least one etched hole, wherein the etched hole covers the bit line structure and frame structures at two sides of the bit line structure; and performing a complete etching in the third direction along the etched hole to form a first trench, wherein the complete etching is used for removing the frame structures, the bit line structure and the filled first material located under the etched hole;

performing a lateral etching in a direction perpendicular to the third direction with the first trench to form the air gaps; and forming a dummy structure in the first trench, wherein the air gaps are retained.

6. The method according to claim 5, wherein
a width of the etched hole in the first direction has a first value, and widths of the bit line structure and the frame structures at the two sides of the bit line structure in the first direction have a second value, and the first value is greater than the second value.

7. The method according to claim 6, wherein
during performing the lateral etching in the direction perpendicular to the third direction with the first trench, the first material is etched outward relative to sidewalls of the first trench until stopping at adjacent frame structures, and the air gaps are allowed to communicate with each other in the second direction.

8. The method according to claim 6, forming the air gaps by etching with the etched hole comprises:
performing a partial etching in the third direction along the etched hole to form an etched gap, wherein the partial etching is used for removing the filled first material, wherein the frame structures and the bit line structure are retained; and performing a lateral etching in a direction perpendicular to the third direction with the etched gap to form the air gaps, wherein the first material is etched outward relative to sidewalls of the etched gap, and the etching of the first material is stopped at adjacent frame structures of the etched gap, and the air gaps are allowed to communicate with each other in the second direction.

9. The method according to claim 7, wherein
forming the dummy structure in the first trench comprises:
filling a second material into the first trench to form the dummy structure, wherein a width of the dummy structure in the first direction has a first value.

10. The method according to claim 9, wherein
the first material comprises a low dielectric constant material, silicon oxide or silicon nitride, and the second material comprises silicon oxide.

11. A semiconductor memory comprising
the semiconductor structure according to claim 1.

* * * * *